US005801528A

United States Patent [19]

Katoh et al.

[11] Patent Number: 5,801,528

[45] Date of Patent: Sep. 1, 1998

[54] SEMICONDUCTOR ELEMENT EVALUATING APPARATUS

[75] Inventors: Takayuki Katoh; Hiroto Matsubayashi, both of Tokyo, Japan

[73] Assignee: Mitsubishi Denki Kabushiki Kaisha, Tokyo, Japan

[21] Appl. No.: 613,988

[22] Filed: Mar. 11, 1996

[30] Foreign Application Priority Data

Jul. 12, 1995 [JP] Japan .................................... 7-176076

[51] Int. Cl.[6] .................................................... G01R 31/02

[52] U.S. Cl. .......................................................... 324/158.1

[58] Field of Search ................................ 324/158.1, 73.1

[56] References Cited

U.S. PATENT DOCUMENTS

| | | | |
|---|---|---|---|
| 4,697,143 | 9/1987 | Lockwood et al. | 329/58.1 |
| 4,827,211 | 5/1989 | Strid et al. | 324/73.1 |

OTHER PUBLICATIONS

Angelov et al, "An F–Band Resistive Mixer Based On Heterostructure Field Effect Transistor Technology", IEEE MTT–S Digest, 1993, pp. 787–790 (Mouth unavailable).

*Primary Examiner*—Ernest F. Karlsen
*Assistant Examiner*—Anh Phung
*Attorney, Agent, or Firm*—Leydig, Voit & Mayer, Ltd.

[57] ABSTRACT

A semiconductor element evaluating apparatus for evaluating an electrical characteristic of a semiconductor element used in a microwave band includes a pedestal having first and second waveguide parts for exchanging signals with external devices and penetrating the pedestal, a mode converting carrier member placed on the pedestal and having first and second waveguide parts and first and second microstrip lines sandwiching a region where a semiconductor element is to be mounted, and waveguide terminal structures placed on the mode converting carrier member. The first and second waveguide parts of the pedestal, the mode converting carrier member, and the terminal parts form first and second waveguides. One semiconductor element can be exchanged for another semiconductor element merely by exchanging one mode converting carrier member for another, and the length of the transmission line is shortened whereby transmission loss is reduced.

8 Claims, 15 Drawing Sheets

6
6
5
5
3
4
2a
8
8
7
1a
11b

SEMICONDUCTOR ELEMENT EVALUATING APPARATUS

FIELD OF THE INVENTION

The present invention relates to an apparatus for evaluating semiconductor elements and, more particularly, to an apparatus for evaluating semiconductor elements that operate in a microwave band, mainly in a millimeter wave band exceeding 30 GHz.

BACKGROUND OF THE INVENTION

At present, especially in a semiconductor device which operates in a millimeter wave band exceeding 30 GHz, a metal waveguide is most as a signal transmission line in a system interface FIG. 13 is a perspective view including a cross-section of a metal waveguide. In the figure, reference numeral 10 designates a rectangular waveguide formed by metal walls, and arrows E represent electric force lines. The electric force lines in the waveguide 10 when signals are transmitted through the waveguide 10 in a TE10 mode are as shown in FIG. 13.

Meanwhile, in a monolithic integrated circuit, microstrip lines are used as signal transmission lines. FIG. 14 is a perspective view including a cross-section of a microstrip line. In the figure, reference numeral 41 designates a dielectric substrate, and a microstrip signal conductor 42 is disposed on the front surface of the dielectric substrate 41 and a grounding conductor 43 is disposed on the rear surface of the substrate 41. The electric force lines when signals are transmitted through a microstrip line 4 comprising the dielectric substrate 41, the microstrip signal conductor 42, and the grounding conductor 43 become a quasi-TEM mode as shown in FIG. 14. Although the transmission loss of the microstrip line is larger than that of the waveguide, this microstrip line has the advantage of easier processing and larger degree of freedom in circuit design.

Generally, in evaluating a semiconductor element, when a semiconductor integrated circuit element comprising a microstrip line is connected to an interface of a system comprising a waveguide, it is necessary to convert the respective modes between the microstrip line and the waveguide. A package (chip carrier) or a fixture of the package is usually provided with the mode converting function.

There are some methods for converting the modes, and the most general converting method is called E-plane probe. A description is given of the E-plane probe.

FIGS. 15 and 16 are a perspective view and a cross-sectional view of an E-plane probe region, respectively. This method includes forming an aperture 100 on a side surface of a square waveguide 10 including a longer side of a rectangle seen on a cross-section perpendicular to the longitudinal direction of the waveguide, i.e., an E-plane 10*e* of the waveguide 10, and putting the microstrip line 4 therein, thereby shifting the direction along which signals are transmitted by 90°. Although the converting method has the defect that airtightness of a bonded portion between the waveguide 10 and the microstrip line 4 is reduced, it has the advantage that the loss of the signals is small due to the noncontact conversion and the adjustment is simplified due to the simple structure. While in FIGS. 15 and 16 the upper surface of the microstrip line 4 and the short-circuit plane 10*s* of the end portion of the waveguide 10 are parallel to each other, these surfaces can be formed so as to cross at right angles.

FIG. 17 is an exploded perspective view illustrating a semiconductor element evaluating apparatus using the E-plane probe converting method. In the figure, reference numeral 3 designates a semiconductor element, numeral 12 designates a bonding wire, and numerals 1ja and 1jb designate metal bodies of a package. IEEE MTT-S Digest, Z-5, 1993 discloses this figure and, in the apparatus, the metal body 1ja having waveguide parts is adhered to the semiconductor element 3 with solder or the like.

FIG. 18 is an exploded perspective view illustrating a semiconductor element evaluating apparatus using the E-plane probe converting method, and FIG. 19 is a cross-sectional view of the semiconductor element evaluating apparatus which is assembled. In the figures, a semiconductor element 3 and microstrip lines 4*a* which are located on a chip carrier 2*j* are connected to each other with bonding wires 12. The chip carrier 2*j* is placed on a base block 20*j*, and microstrip lines 4*b* are placed on converting blocks 21*j*. Then, the base blocks 20*j* and the converting blocks 21*j* are assembled and the microstrip lines 4*a* and 4*b* are connected to each other with bonding wires 12. Finally, spacers 5*j*, short-circuitting plates 6*j*, and waveguide bends 10*j* for transmitting input and output signals, each bend having a flange 11*a* for connecting the waveguide bend 10*j* to the converting block 21*j* and a flange 11*b* for connecting the waveguide bend 10*j* to an external device at both ends, are assembled, completing the semiconductor element evaluating apparatus.

The semiconductor element evaluating apparatus as described above is usually made of a metal and mostly Auplated.

In the prior art semiconductor element evaluating apparatus shown in FIG. 17, it is easy to fabricate the apparatus due to the simple structure. In addition, since the space between the respective waveguide parts is narrowed, the length of the microstrip lines 4 is shortened, whereby the transmission loss caused by long microstrip lines 4 can be reduced. However, since the semiconductor element 3 and the metal body 1ja are united with each other by soldering, when many semiconductor elements 3 are evaluated, as many metal bodies 1ja as the semiconductor elements 3 are required. Also, when the semiconductor element 3 is damaged, it is scrapped, together with the metal body 1ja, or it is exchanged for another semiconductor element 3 requiring the that the damaged semiconductor element 3 and the bonding wires 12 be removed to mount another semiconductor element 3. Therefore, when many semiconductor elements 3 are evaluated, the cost per semiconductor element required to exchange the semiconductor elements is increased.

Meanwhile, in the prior art semiconductor element evaluating apparatus shown in FIGS. 18 and 19, since the evaluation of many semiconductor elements is carried out by exchanging the chip carriers 2*j*, the cost required to exchange the elements is reduced, as compared with the apparatus shown in FIG. 17. However, the wire bonding is required not only between the microstrip lines 4*a* and the input and output parts of the semiconductor element 3 but also between the microstrip lines 4*a* and 4*b*, whereby transmission loss due to bonding wires (more than 0.2 dB at 94 GHz) and the impedance mismatch occur. In addition, since the loss due to the bonding wires depends heavily on the forms of the wires, reproducibility and precision of the measured values when the semiconductor elements are evaluated are deteriorated.

Further, as is found from FIG. 19, since the total length Lm of the microstrip lines, i.e., the length of the straight line along the semiconductor element 3 and the microstrip lines 4a and 4b, is shortened only to about the diameter Lf of the flange 11a (19.1 mm at 75–110 GHz in operating frequency), the transmission loss caused by long microstrip lines can not be made smaller than a minimum value.

SUMMARY OF THE INVENTION

It is an object of the present invention to provide a semiconductor element evaluating apparatus in which exchange of semiconductor elements when the semiconductor elements are evaluated is facilitated to reduce the cost of the exchange of the semiconductor elements, the loss caused by the total length of microstrip lines, the forms of bonding wires, the forms of waveguides, and the like is reduced, and reproducibility of evaluated data is improved.

Other objects and advantages of the present invention will become apparent from the detailed description given hereinafter; it should be understood, however, that the detailed description and specific embodiment are given by way of illustration only, since various changes and modifications within the scope of the invention will become apparent to the those skilled in the art from this detailed description.

According to a first aspect of the present invention, a semiconductor element evaluating apparatus for evaluating an electrical characteristic of a semiconductor element used in a microwave band comprises a pedestal having first and second square waveguide parts for exchanging signals with external devices, each waveguide part penetrating the pedestal, a mode converting carrier member placed on the pedestal, and having first and second square waveguide parts which are connected to the respective first and second square waveguide parts of the pedestal and having first and second microstrip lines disposed with sandwiching a region where the semiconductor element is mounted, and connected to the semiconductor element, each line converting a mode between the microstrip line and the square waveguide, and waveguide terminal structures placed on the mode converting carrier member, and respectively having first and second square waveguide terminal parts for terminating the respective first and second square waveguide parts of the mode converting carrier member. The first and second square waveguide parts of the pedestal and of the mode converting carrier member, and the first and second square waveguide terminal parts form first and second square waveguides, respectively, and signals input to the first square waveguide are compared with signals output from the second square waveguide by that the input signals travel successively through the first square waveguide, the first microstrip line, the semiconductor element, the second microstrip line, and the second square waveguide, whereby the semiconductor element is evaluated. Therefore, the semiconductor element is exchanged for another semiconductor element only by exchanging the mode converting carrier member for another, and the length of the transmission line is shorten, the wire bonding except at the semiconductor element facet is not required, whereby the loss caused by the length of the transmission line and the forms of bonding wires can be reduced.

According to a second aspect of the present invention, the above-described first and second square waveguide parts of the pedestal are curved at 90° so that the pipe axis direction of the signal input part and the signal output part respectively of the first and second square waveguides are on a straight line, and the pipe axis direction of the end portions of the first and second square waveguide parts of the pedestal on the mode converting carrier member side are parallel to each other. Therefore, the adjustability of the semiconductor element evaluating apparatus and external devices can be improved.

According to a third aspect of the present invention, the above-described pedestal has a concave portion formed between the end portions of the first and second square waveguide parts of the pedestal on the upper surface of the pedestal where the mode converting carrier member is to be placed. The concave portion is apart from each of the opposite inner wall surfaces at the end portions of the first and second square waveguide parts of the pedestal by ¼ of the operating frequency wavelength ($\lambda/4$), in the direction perpendicular to the opposite inner wall surfaces, and has a prescribed width and a depth of $\lambda/4$. Therefore, the adhesion of the bonded portions of the square waveguides between the pedestal and the mode converting carrier member is improved, and the impedance of the inner wall surfaces at the bonded portions of the square waveguides is made uniform, whereby the continuity of the inner wall surfaces can be emphasized.

According to a fourth aspect of the present invention, the above-described mode converting carrier member has projections on the upper surface where the waveguide terminal structures are to be placed, each projection having a width of $\lambda/4$ from each of the inner wall surfaces of the square waveguide part of the mode converting carrier member and having a height of $\lambda/4$. Therefore, the adhesion of the bonded portions of the square waveguides between the pedestal and the mode converting carrier member and between the mode converting carrier member and the waveguide terminal structures is improved, and the impedance of the inner wall surfaces at the bonded portions of the square waveguides is made uniform, whereby the continuity of the inner wall surfaces can be emphasized.

According to a fifth aspect of the present invention, the above-described mode converting carrier member has a region where the semiconductor element is to be mounted and regions where the microstrip lines are to be mounted, and comprises a semiconductor carrier member having first and second waveguide forming portions each forming one (three) of the four inner wall surfaces of the square waveguide part, and side block parts being adjacent to the right and left side surfaces of the semiconductor carrier member so as to sandwich the carrier member and respectively having first and second waveguide forming portions each forming three (one) of the four inner wall surfaces of the square waveguide part. Therefore, the form of the carrier member where the semiconductor element is to be mounted can be further made simple, and it is possible to approach every corner of each square waveguide part which is formed by the semiconductor carrier member and the side block part to a right angle.

According to a sixth aspect of the present invention, the above-described first and second side block parts have concave portions formed on the side surfaces of the side block parts adjacent to the semiconductor carrier member, each concave portion being apart from the inner wall surface of the square waveguide part perpendicular to the side surface of the side block part by $\lambda/4$ in the direction perpendicular to the inner wall surface, and having a prescribed width and a depth of $\lambda/4$. Therefore, the adhesion of the bonded portions of the square waveguides between the semiconductor carrier member and the side block parts is improved, and the impedance of the inner wall surfaces at the bonded portions of the square waveguides is made uniform, whereby the continuity of the inner wall surfaces can be emphasized.

DETAILED DESCRIPTION OF THE PREFERRED EMBODIMENT

[Embodiment 1]

A description is given of a first embodiment of the present invention.

Figure 1:
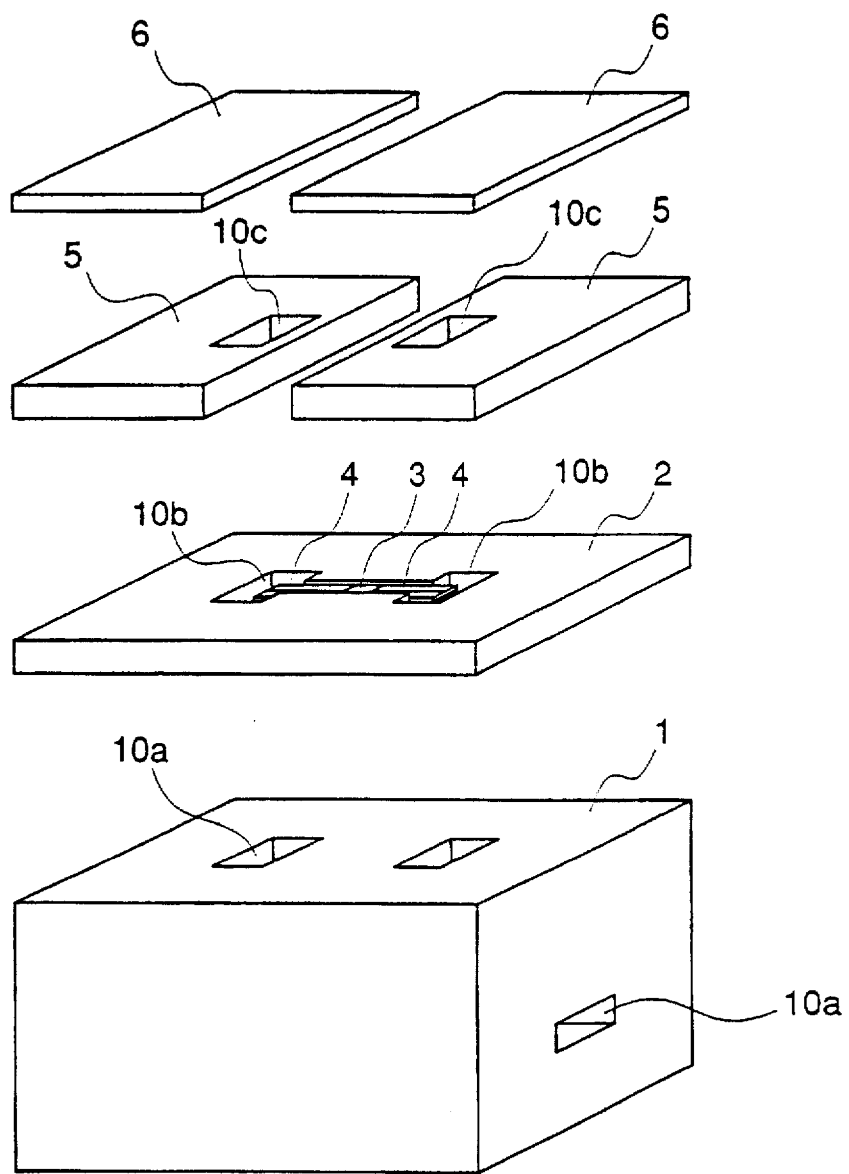
FIG. 1 is an exploded perspective view illustrating a semiconductor element evaluating apparatus in accordance with a first embodiment of the present invention.
Figure 2:
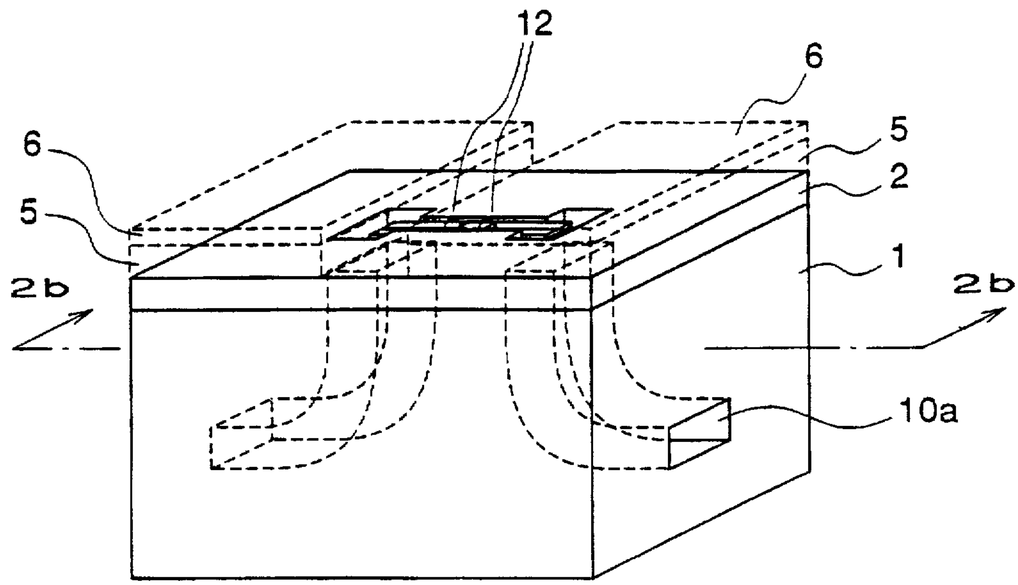
FIGS. 2(*a*) and 2(*b*) are a partial perspective view and a cross-sectional view each illustrating the semiconductor element evaluating apparatus according to the first embodiment of the invention.
Figure 2:
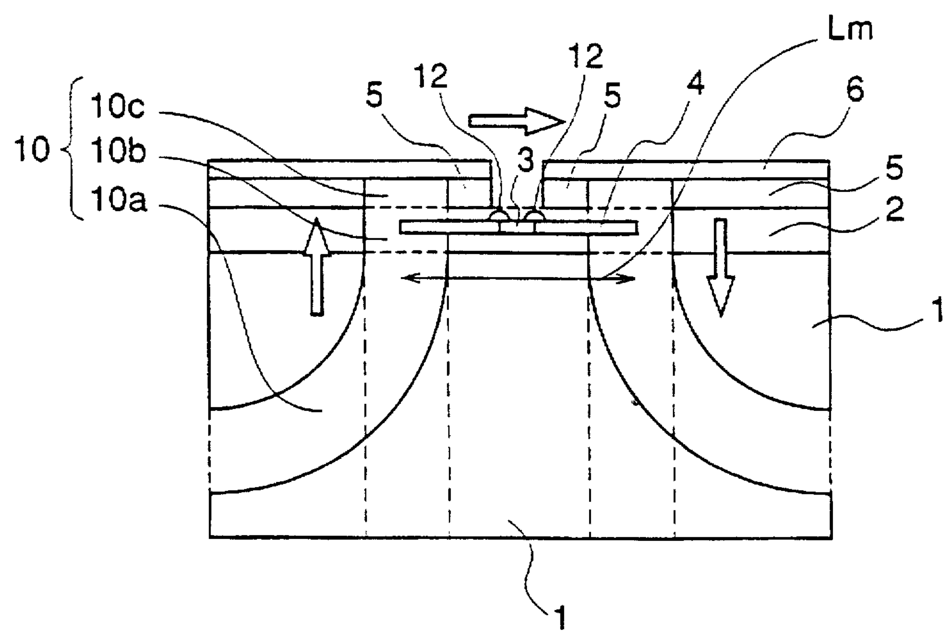

FIG. 1 is an exploded perspective view illustrating a semiconductor element evaluating apparatus according to the first embodiment of the invention. FIG. 2(*a*) is a partial perspective view illustrating the semiconductor element evaluating apparatus which is assembled, and FIG. 2(*b*) is a cross-sectional view of the semiconductor element evaluating apparatus taken along line 2b—2b in FIG. 2(*a*).

Figure 14:
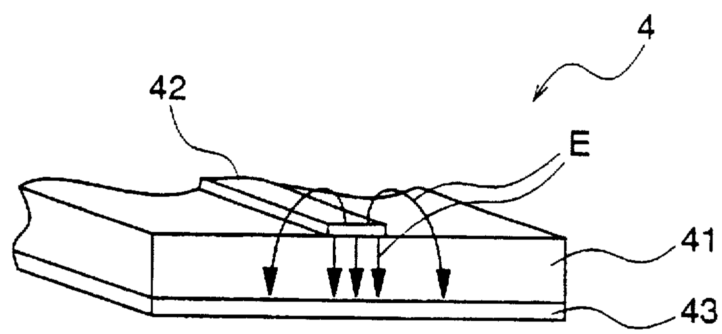
FIG. 14 is a perspective view showing a general transmission mode of a microstrip line.
Figure 15:
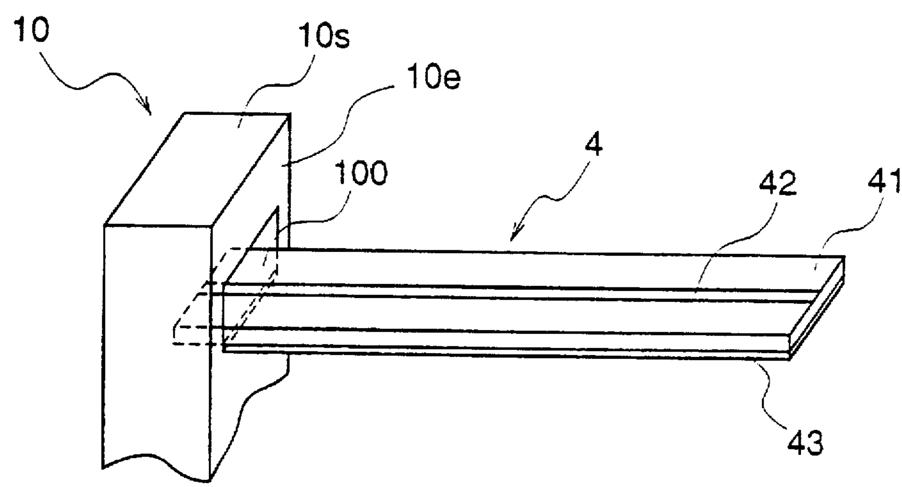
FIG. 15 is a perspective view showing a general E-plane probe converting method.
Figure 16:
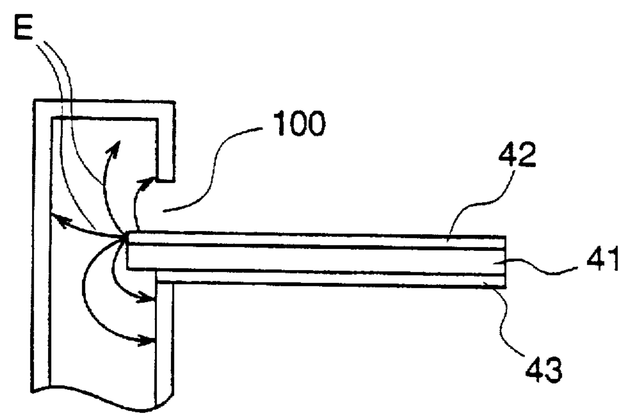
FIG. 16 is a cross-sectional view showing a general E-plane probe converting method.

In these figures, reference numeral 1 designates a pedestal having wave guides 10*a* for exchanging signals with external devices. A mode converting carrier 2 having waveguide parts 10*b* which are connected to the respective waveguide parts 10*a* of the pedestal 1 is placed on the pedestal 1. A semiconductor element 3 and microstrip lines 4 are located on the mode converting carrier 2 and are connected to each other. Spacers 5 are placed on the mode converting carrier 2, and short-circuiting plates 6 are placed on the respective spacers 5. The spacers 5 and the short-circuiting plates 6 form waveguide terminal parts 10*c* which are connected to the respective waveguide parts 10*b* of the mode converting carrier 2. As in the prior art apparatus shown in FIG. 14, the microstrip line 4 comprises the dielectric substrate 41, the microstrip signal conductor 42, and the grounding conductor 43. The microstrip signal conductor 42 is disposed on the front surface of the dielectric substrate 41, and the grounding conductor 43 is disposed on the rear surface of the substrate 41. When the respective parts are assembled, waveguides 10 are formed by the waveguide parts 10*a* and 10*b* and the waveguide terminal parts 10*c*.

A description is given of the structure of the semiconductor element evaluating apparatus, the fabricating method, and the mounting method.

Initially, the semiconductor element 3 and the microstrip lines 4 are adhered with solder or the like to a concavity which is formed at a region of the mode converting carrier 2 on which the semiconductor element 3 and the microstrip lines 4 are to be located. Then, input and output terminals of the semiconductor element 3 and the microstrip signal conductors 42 of the microstrip lines 4 are connected to each other with bonding wires 12, respectively.

Thereafter, the mode converting carrier 2 on which the semiconductor element 3 and the microstrip lines 4 are mounted, the spacers 5, and the short-circuiting plates 6 are successively placed and fixed with screws (not shown) or the like on prescribed positions of the pedestal 1 so that the waveguide parts 10*a* and 10*b* and waveguide terminal parts 10*c* of the respective parts are respectively connected to each other, completing the semiconductor element evaluating apparatus including the semiconductor element which is mounted.

FIG. 2(*b*) is a cross-sectional view illustrating the semiconductor element evaluating apparatus which is assembled as described above. The waveguide parts 10*a* and 10*b* and the waveguide terminal parts 10*c* respectively form waveguides 10, and signals flow through the waveguides 10 and the microstrip lines 4, for example, along arrows shown in FIG. 2(*b*).

A description is given of one example of a fabricating method of the pedestal 1 having the waveguide parts 10*a* which are curved at 90° in the pipe axis direction.

Initially, a rectangular parallelepiped block which is made of a metal and a metal plate having a rectangular surface identical to the front surface of the rectangular parallelepiped block are prepared and, using a rotating cutter having an edge in the direction perpendicular to the surface of the rotation which is provided at a position of a prescribed radius away from the center of the rotation, arc-shaped grooves each having the central angle of 90° and having a prescribed width and a prescribed depth are formed on the front surface of the rectangular parallelepiped block from the upper surface of the block toward the left and right side surfaces thereof. Then, the front surface of the rectangular parallelepiped block where the grooves are formed and the rectangular surface of the metal plate are adhered to each other are united, whereby the pedestal 1 including the waveguides 10 is formed.

While in the first embodiment of the invention the waveguide parts 10*a* are curved, straight ones shown by dotted lines in FIG. 2(*b*) may be used according to the applications.

A description is given of the function.

Figure 17:
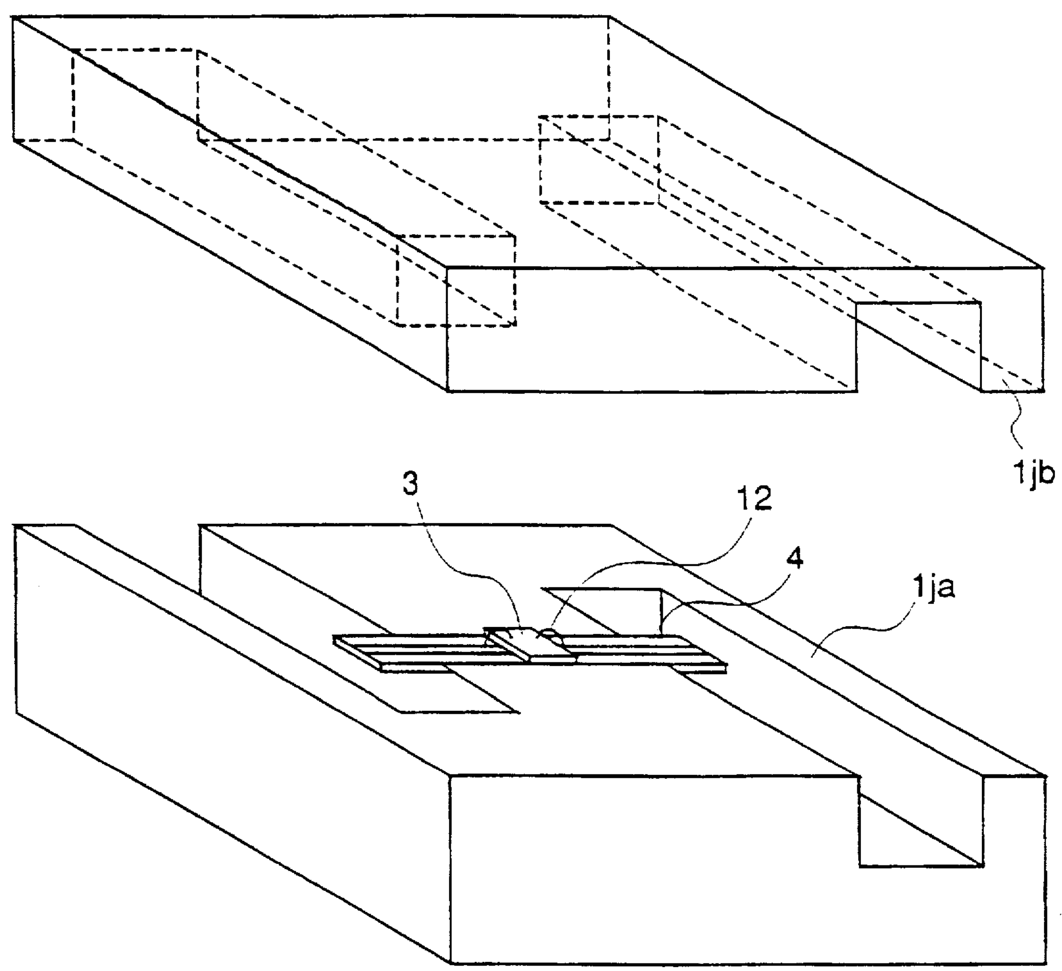
FIG. 17 is an exploded perspective view illustrating a prior art semiconductor element evaluating apparatus.

In the first embodiment of the invention, when many semiconductor elements 3 are evaluated, since the mode converting carrier 2 which can be separated from the pedestal 1 is provided as shown in FIG. 1, different semiconductor elements 3 are evaluated merely by exchanging the mode converting carrier 2 for another mode converting carrier 2 on which another semiconductor element 3 is mounted, whereby the number of exchanged parts of the semiconductor element evaluating apparatus is decreased, as compared with the prior art apparatus shown in FIG. 17. Especially, since a semiconductor element evaluating apparatus used in a microwave band is usually made of a metal and mostly Au-plated, the cost required to exchange semiconductor elements is further reduced because the number of exchanged parts of the apparatus is decreased. Furthermore, when the semiconductor element 3 to be evaluated is damaged, it is exchanged for another semiconductor element 3 merely by exchanging the mode converting carriers 2, whereby the process for exchanging semiconductor elements is simplified.

Figure 18:
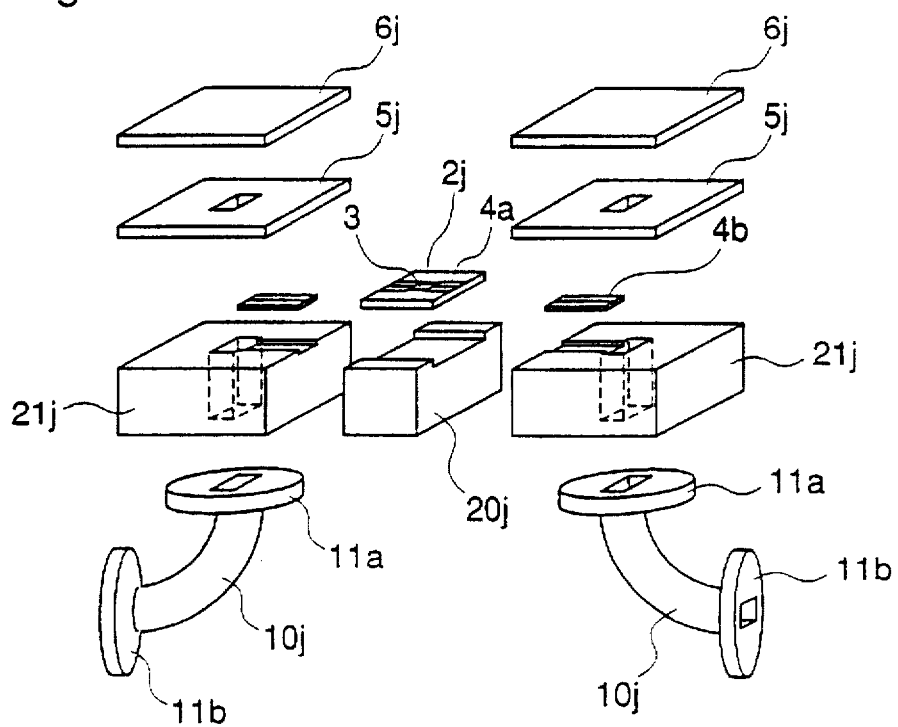
FIG. 18 is an exploded perspective view illustrating a prior art semiconductor element evaluating apparatus.
Figure 19:
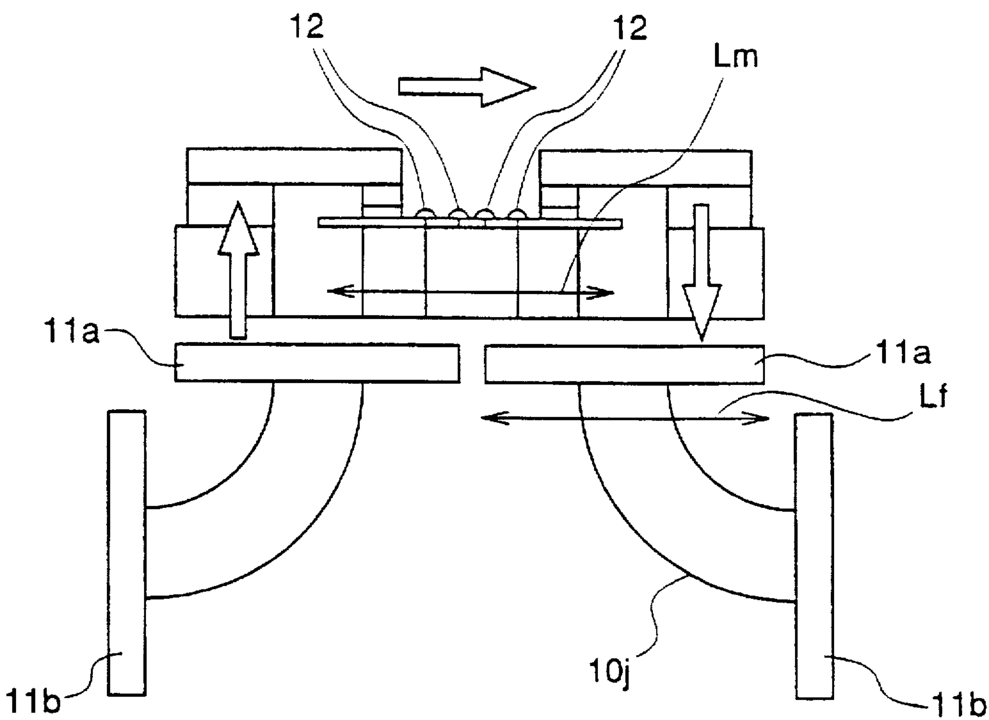
FIG. 19 is a cross-sectional view of the prior art semiconductor element evaluating apparatus.

Since the semiconductor element evaluating apparatus according to the first embodiment of the invention has the waveguide parts 10*a* in the pedestal 1, it is not required to provide the flanges 11*a* of the waveguide bends 10*j* as in the prior art apparatus shown in FIGS. 18 and 19. Therefore, the total length Lm of the microstrip lines 4 which respectively connect the semiconductor element 3 to the waveguides is shortened as occasion demands without being limited by the diameters of the flanges 11*a*. Accordingly, the transmission loss caused by long microstrip lines 4 is reduced. In addition, since the apparatus according to the first embodiment has the waveguide parts 10*b* in the mode converting carrier 2, it is not necessary to connect the microstrip lines 4*a* which are located on the chip carrier 2*j* on the base block 20*j* to the microstrip lines 4*b* which are located on the converting blocks 21*j* with the bonding wires 12 as in the prior art apparatus shown in FIGS. 18 and 19, whereby the bonding wires 12 are dispensed with. Consequently, in the first embodiment of the invention, since it is not necessary to perform wire bonding when the mode converting carrier 2 is exchanged, the exchange of the mode converting carrier 2 is facilitated and degradation of the microstrip lines 4 due to repetition of the wire bonding does not occur, as compared with the prior art apparatus shown in FIGS. 18 and 19. In addition, since the number of the bonding wires is reduced, degradation of reproducibility and precision of measured values which is caused by the inductances of the wires is suppressed.

Also, as shown in FIGS. 2(*a*) and 2(*b*), the waveguide parts 10*a* which are formed in the pedestal 1 are curved at 90° in the pipe axis direction and the direction of the input part and the direction of the output part of the waveguides are on a straight line, whereby the connection of the waveguides to external devices is facilitated, resulting in improved handling. Further, the waveguide parts which are curved at 90° in the pipe axis direction are more easily fabricated.

As described above, in the semiconductor element evaluating apparatus according to the first embodiment of the invention, since the mode converting carrier 2 which can be separated from the pedestal 1 is provided, the cost required to exchange the semiconductor elements is reduced and the process for exchanging the semiconductor elements is simplified, as compared with the prior art apparatus shown in FIG. 17.

Further, since the apparatus according to the first embodiment has the waveguide parts 10*a* in the pedestal 1, the total length Lm of the microstrip lines 4 is shortened, whereby the transmission loss is reduced as compared with the prior art apparatus shown in FIGS. 18 and 19. In addition, since the apparatus according to the first embodiment has the waveguide parts 10*b* in the mode converting carrier 2, the number of bonding wires 12 is reduced, whereby the exchange of the mode converting carrier 2 is facilitated and degradation of reproducibility and precision of measured values which is caused by the inductances of the wires is suppressed, as compared with the prior art apparatus shown in FIGS. 18 and 19.

Furthermore, the waveguide parts 10*a* which are formed in the pedestal 1 are curved at 90° in the pipe axis direction and the direction of the input part and the direction of the output part of the waveguides are on a straight line, whereby the adjustability of the semiconductor element evaluating apparatus and external devices can be improved.

[Embodiment 2]

A description is given of a second embodiment of the present invention.

Figure 3:
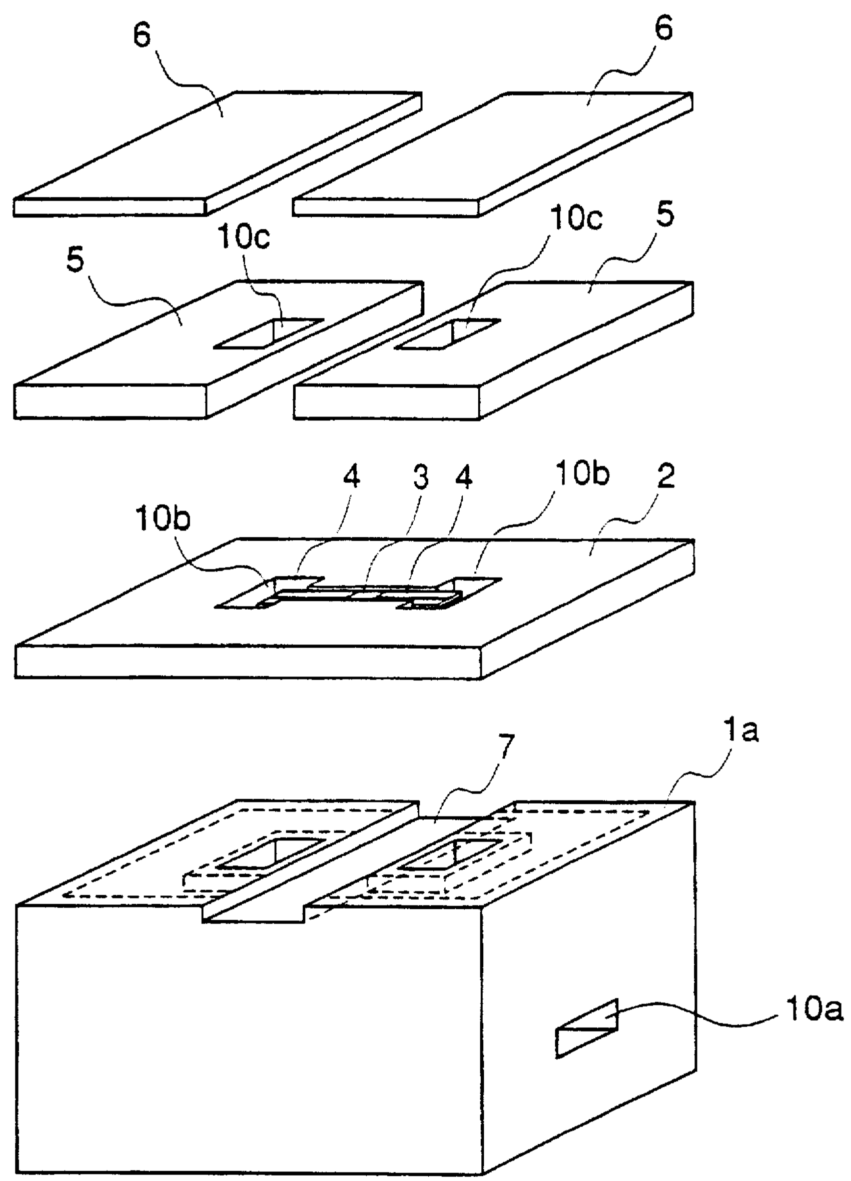
FIG. 3 is an exploded perspective view illustrating a semiconductor element evaluating apparatus in accordance with a second embodiment of the present invention.
Figure 4:
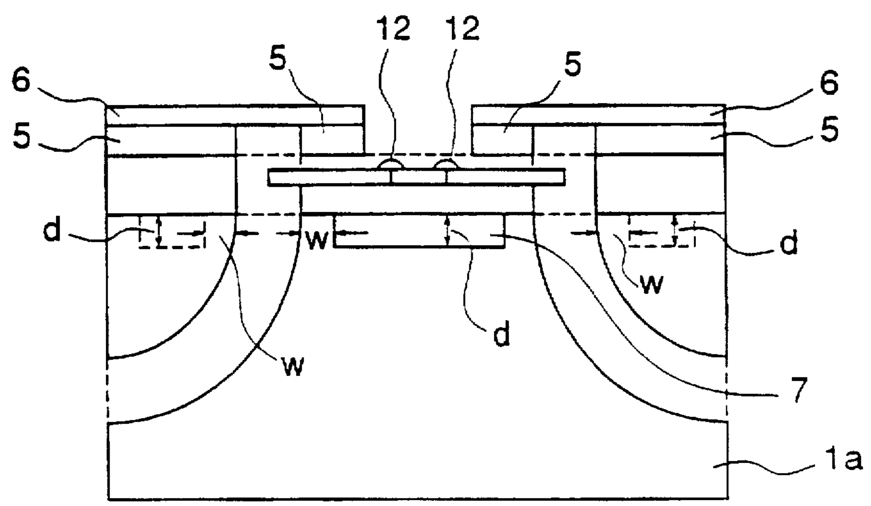
FIG. 4 is a cross-sectional view illustrating the semiconductor element evaluating apparatus according to the second embodiment of the invention.

FIG. 3 is an exploded perspective view illustrating a semiconductor element evaluating apparatus according to the second embodiment of the invention. FIG. 4 is a cross-sectional view of the semiconductor element evaluating apparatus shown in FIG. 3 which is assembled. In the figures, a concave portion 7 is formed on an upper surface of a pedestal 1*a*, and the same reference numerals are used to designate the same or corresponding portions as those shown in FIGS. 1 and 2(*a*) and 2(*b*)

The semiconductor element evaluating apparatus according to the second embodiment of the invention includes a concave portion 7 between the end portions of the waveguide parts 10*a* on the upper surface of the pedestal 1*a* where the mode converting carrier 2 is to be placed. More specifically, the concave portion 7 is spaced apart from each of the opposite inner wall surfaces at the end portions of the waveguide parts 10*a* by ¼ of the operating frequency wavelength (λ/4), in the direction perpendicular to the opposite inner wall surfaces. Further, the concave portion 7 has a prescribed width and a depth of λ/4.

The concave portion 7 may be formed also in regions of the pedestal 1*a* shown by dotted lines in FIG. 3 so as to surround the respective waveguide parts 10*a* at a distance of λ/4 from each of the four inner wall surfaces at the end portions of the waveguide parts 10*a*.

A description is given of the function.

Figure 5:
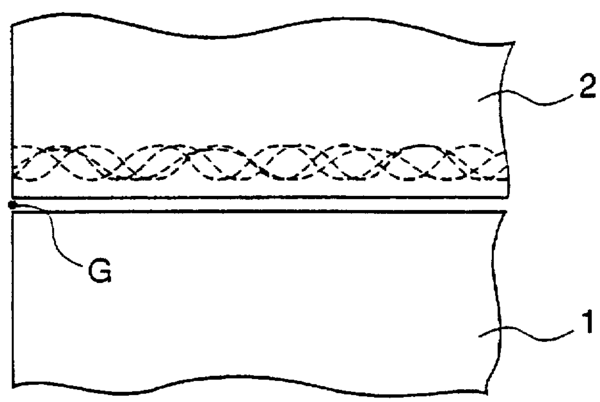
FIGS. 5(*a*)–5(*d*) are enlarged cross-sectional views each explaining the function of the semiconductor element evaluating apparatus according to the second embodiment of the invention.
Figure 5:
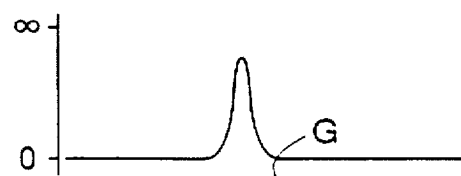
Figure 5:
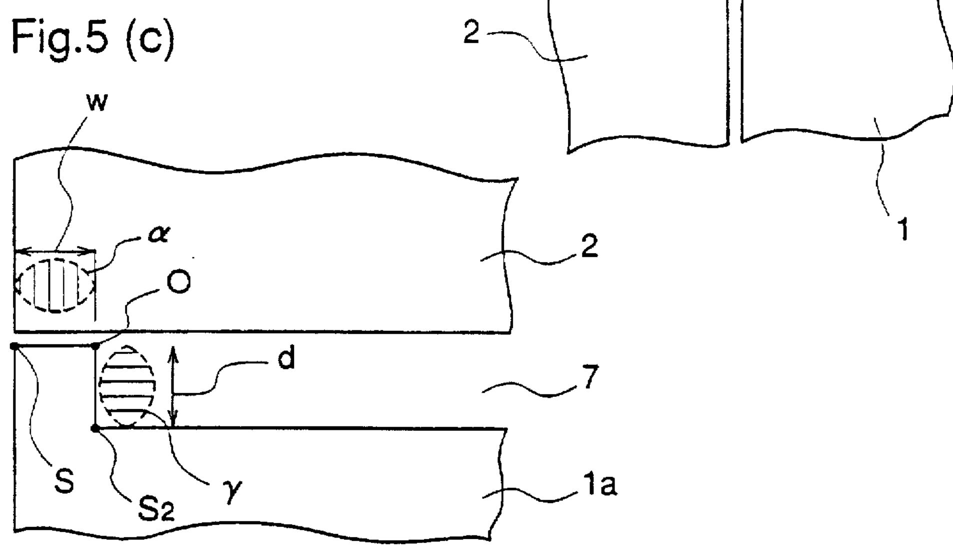
Figure 5:
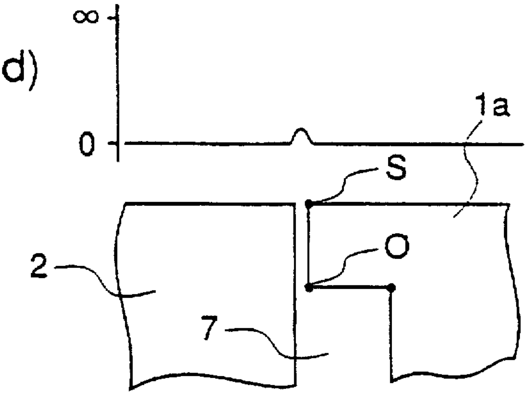

FIGS. 5(*a*) and 5(*c*) are enlarged cross-sectional views each illustrating a portion of the semiconductor element evaluating apparatus in which a space is produced between the pedestal 1 (1*a* ) and the mode converting carrier 2 due to irregularities or foreign matter at the contact surface between them when the apparatus is assembled. FIG. 5(*a*) is an enlarged cross-sectional view when a concave portion is not formed on the upper surface of the pedestal 1 and a space is produced between the pedestal 1 and the mode converting carrier 2, and FIG. 5(*c*) is an enlarged cross-sectional view when the concave portion 7 is formed thereon as in the second embodiment of the invention and a space is produced between the pedestal 1*a* and the mode converting carrier 2. FIGS. 5(*b*) and 5(*d*) are graphs showing hypothetical impedance values at respective positions of the inner wall surfaces of the waveguides in the vicinity of the bonded portions of the waveguide parts shown in FIGS. 5(*a*) and 5(*c*), respectively. The impedance value is 0 at the short-circuit plane and the value is infinity at the open-circuit plane.

In the second embodiment of the invention, since the concave portion 7 is present on the upper surface of the pedestal 1*a* except in the vicinity of the bonded portions of the waveguide parts 10*a* and 10*b*, the pedestal 1*a* and the mode converting carrier 2 are bonded to each other mainly in the vicinity of the inner wall surfaces of the waveguide parts 10*a* and 10*b*. Therefore, even when there are irregularities on the upper surface of the pedestal 1*a* and on the lower surface of the mode converting carrier 2 except in the vicinity of the inner wall surfaces, these irregularities do not adversely affect the bonding of the pedestal 1*a* and the mode converting carrier 2 because the concave portion 7 is formed thereon, whereby the bonded portions of the waveguide parts 10*a* and 10*b* can be adhered closely to each other with high reliability.

Further, since the concave portion 7 is located at a distance of $\lambda/4$ from each of the inner wall surfaces at the end portions of the waveguide parts 10*a* and to a depth of $\lambda/4$, the continuity of the inner wall surfaces at the bonded portions of the waveguide parts 10*a* and 10*b*, in other words, the fact that the inner wall surfaces at the bonded portions of the waveguide parts 10*a* and 10*b* are continuous with respect to radio waves which are propagated through the bonded portions, can be emphasized.

A description is given of the function in which the continuity of the inner wall surfaces at the bonded portions of the waveguide parts 10*a* and 10*b* is emphasized by the concave portion 7.

It is desirable that the inner wall surfaces at the bonded portions of the waveguide parts as shown in FIG. 5(*a*) be continuous. However, impedance values at the respective positions of the inner wall surfaces in the vicinity of the bonded portions are the hypothetical impedance values as shown in FIG. 5(*b*), and the value increases at the point G in the space. The signals at the point G are transmitted from the inner wall surface of the waveguide along the space, as shown by dotted lines in FIG. 5(*a*).

In the second embodiment of the invention, as shown in FIG. 5(*c*), the side surface of the concave portion 7 is formed at a distance of $\lambda/4$ from the inner wall surface of the waveguide part 10*a*, whereby the signals which are transmitted from the point S on the inner wall surface of the waveguide at the bonded portions of the waveguide parts toward the outside of the waveguide produce a standing wave $\alpha$ between the point S and the point O situated at a distance of $\lambda/4$ from the point S. Therefore, while the point S on the inner wall surface of the waveguide functions as a short circuit with respect to the radio waves which are propagated through the bonded portions, i.e., the point S has a short-circuit characteristic, it is emphasized that the point O situated at the upper end of the side surface of the concave portion 7, when it is seen from the point S, functions as an open circuit with respect to the radio waves which are propagated through the bonded portions, i.e., the point O has an open-circuit characteristic, so that the short-circuit characteristic of the point S is emphasized by emphasizing the open-circuit characteristic of the point O.

In addition, the short-circuit characteristic of the point S is further emphasized because that the open-circuit characteristic of the point O is further emphasized.

More specifically, when the bottom surface of the concave portion 7 is at a distance of $\lambda/4$ from the point O where a standing wave $\gamma$ shown by a dotted line in FIG. 5(*c*) is produced, the point $S_2$ at which the side and bottom surfaces of the concave portion 7 intersect is the perfect short-circuit point when it is seen from the point O, so that the open-circuit characteristic of the point O situated at a distance of $\lambda/4$ from the point $S_2$ is more emphasized, whereby the short-circuit characteristic of the point S is further emphasized.

Consequently, because the short-circuit characteristic of the inner wall surfaces in the vicinity of the bonded portions of the waveguide parts is emphasized, the impedance values at the respective positions of the inner wall surfaces at the bonded portions of the waveguide parts are made uniform as shown in FIG. 5(*d*), whereby the continuity of the inner wall surfaces at the bonded portions of the waveguide parts is emphasized.

It is desirable that the depth of the concave portion 7 and the distance between the inner wall surface of the waveguide part and the concave portion are in a range of $\lambda/4\pm10\%$. For example, the values are about 0.8 mm at 90 GHz.

As described above, in the second embodiment of the invention, the concave portion 7 is between the opposite inner wall surfaces on the upper surface of the pedestal 1*a* where the mode converting carrier 2 is placed. Further, the concave portion 7 is spaced apart from each of the opposite inner wall surfaces at the end portions of the waveguide parts 10*a* by $\lambda/4$, in the direction perpendicular to the opposite inner wall surfaces, and has a prescribed width and a depth of $\lambda/4$. Therefore, the bonded portions of the waveguide parts 10*a* and 10*b* between the pedestal 1*a* and the mode converting carrier 2 are adhered closely to each other with high reliability and the impedance values at the respective positions of the inner wall surfaces at the bonded portions of the waveguide parts are made uniform, whereby the continuity of the inner wall surfaces at the bonded portions of the waveguide parts can be emphasized, in addition to the effect of the first embodiment.

[Embodiment 3]

A description is given of a third embodiment of the present invention.

Figure 6:
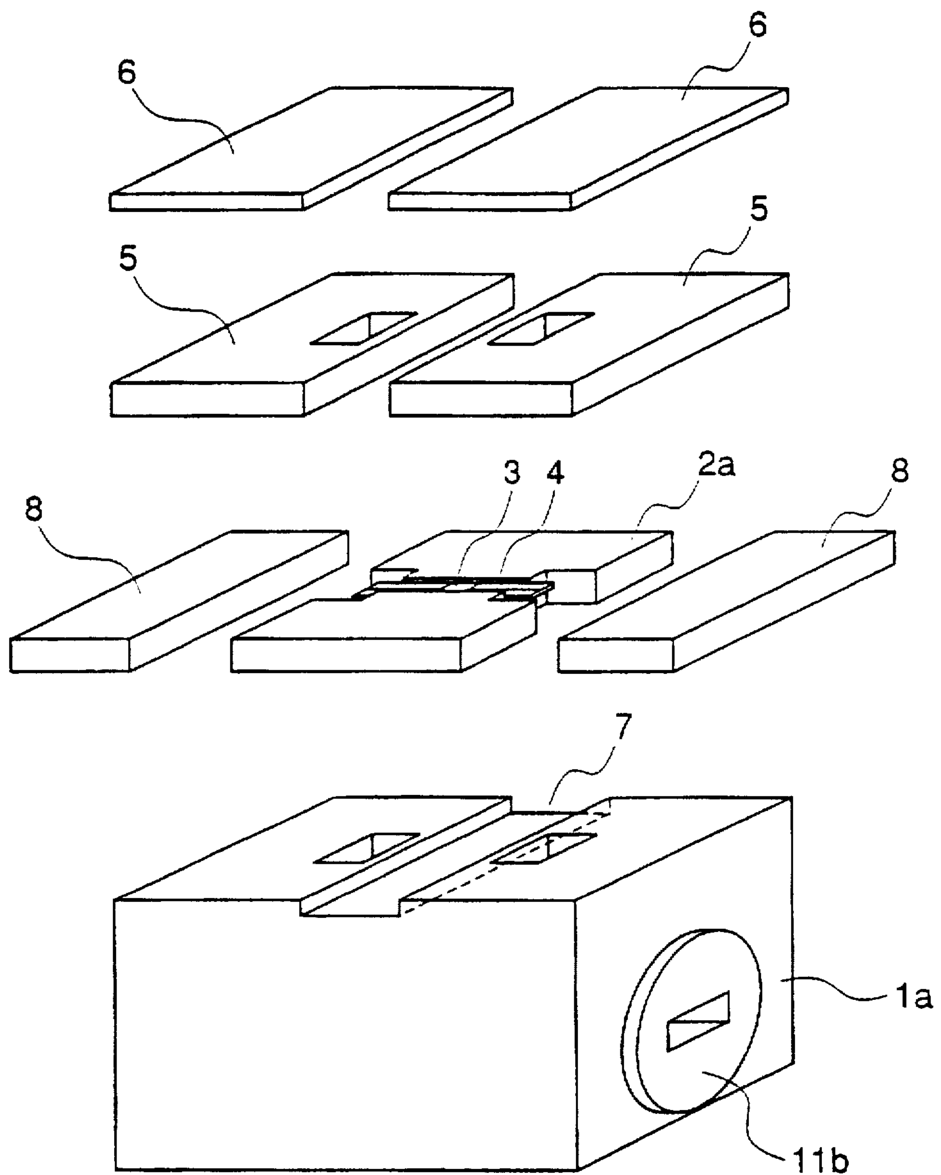
FIG. 6 is an exploded perspective view illustrating a semiconductor element evaluating apparatus in accordance with a third embodiment of the present invention.
Figure 7:
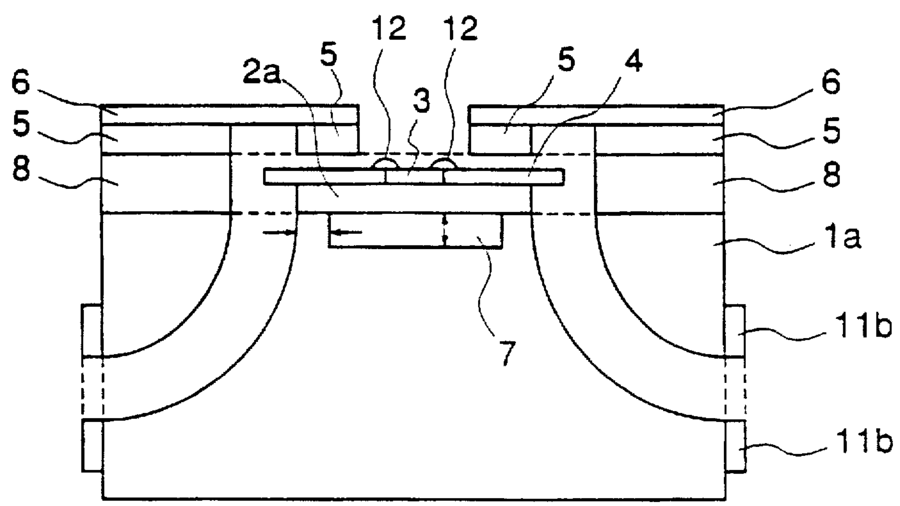
FIG. 7 is a cross-sectional view illustrating the semiconductor element evaluating apparatus according to the third embodiment of the invention.

FIG. 6 is an exploded perspective view illustrating a semiconductor element evaluating apparatus according to the third embodiment of the invention. FIG. 7 is a cross-sectional view illustrating the semiconductor element evaluating apparatus which is assembled. In the figures, reference numeral 2*a* designates a semiconductor carrier on which the microstrip lines 4 and the semiconductor element 3 are located, and side block parts 8 are disposed sandwiching the semiconductor carrier 2*a*. The same reference numerals are used to designate the same or corresponding portions as those shown in FIGS. 1 and 3. Flanges 11*b* for connecting interfaces which input and output signals as shown in FIG. 18 are disposed on both side surfaces of the pedestal 1*a*.

In the semiconductor element evaluating apparatus according to the third embodiment of the invention, the mode converting carrier 2 of the first embodiment shown in FIG. 1 includes the semiconductor carrier 2*a* and the side block parts 8. The semiconductor carrier 2*a* includes a semiconductor element region where the semiconductor element is to be located and microstrip line regions where the microstrip lines are to be located, and has two concavities, each concavity forming three of the four inner wall surfaces of a waveguide part **10*b*. The side block parts 8 are adjacent to the right and left side surfaces of the semiconductor carrier 2*a* so as to sandwich the carrier 2*a*, each having a portion of a side surface as one of the four inner wall surfaces of a waveguide part 10*b*. When the semiconductor carrier 2*a* and the side block parts 8 are assembled, the concavities on the side surfaces of the semiconductor carrier 2*a* and portions of the side surfaces of the respective side block parts 8 are combined, respectively, to form the waveguide parts 10*b***.

A description is given of the function.

As described in the prior art apparatus, since the semiconductor elements are adhered with solder or the like to the regions where the semiconductor elements are mounted, as many semiconductor element regions as semiconductor elements are required. In the semiconductor element evaluating apparatus according to the third embodiment of the invention, the semiconductor carrier **2*a* and the side block parts 8 are combined to form the mode converting carrier 2 described in the first and second embodiments. Therefore, the semiconductor carrier 2*a* on which the semiconductor element is mounted has a simpler form than the mode converting carrier 2 of the semiconductor element evaluating apparatus according to the first and second embodiments, whereby the fabricating process of the semiconductor carrier 2*a* is simplified. As a result, it is possible to reduce the costs of the semiconductor carriers 2*a* which are produced and used in 1*a*** rge numbers.

In addition, it is desirable that every corner in a cross-sectional configuration of a waveguide be small. More specifically, as the corner comes closer to a right angle, the reflection loss and transmission loss during transmitting signals are reduced. In the third embodiment of the invention, since the semiconductor carrier **2*a* and the side block parts 8 which form the waveguide parts 10*b*** can be separated from each other, the processing for making every corner approach a right angle during the fabrication is facilitated, whereby the reflection loss and the transmission loss during transmission signals can be reduced.

Further, in the following first and second modifications of the third embodiment shown in FIGS. 8 and 9, respectively, since the form of the semiconductor carrier is made simpler than that shown in FIG. 6, the fabricating process of the semiconductor carrier is also simplified. Therefore, it is possible to reduce the cost required for exchanging the semiconductor elements. The modifications will be described in detail hereinafter.

Modification 1.

Figure 8:
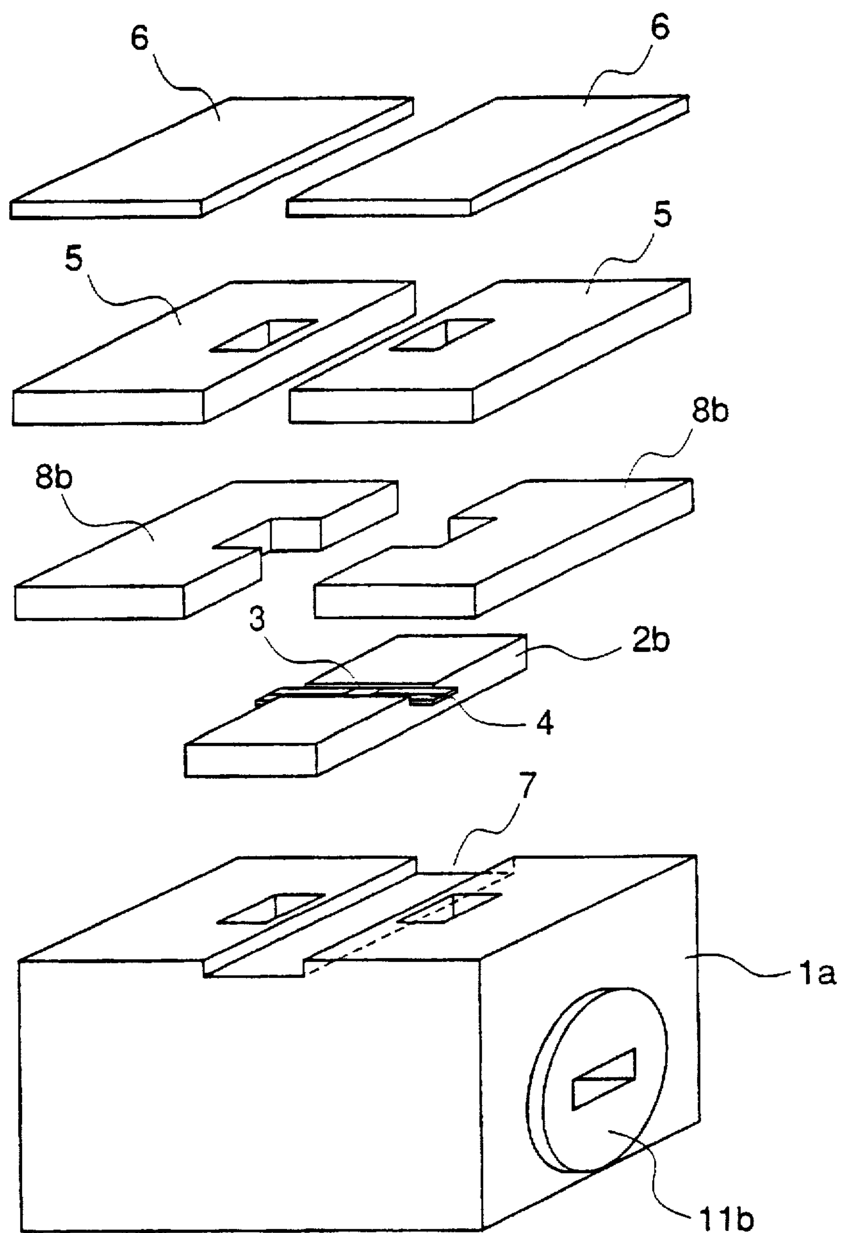
FIG. 8 is an exploded perspective view illustrating a semiconductor element evaluating apparatus according to a first transformation in the third embodiment of the present invention.
Figure 9:
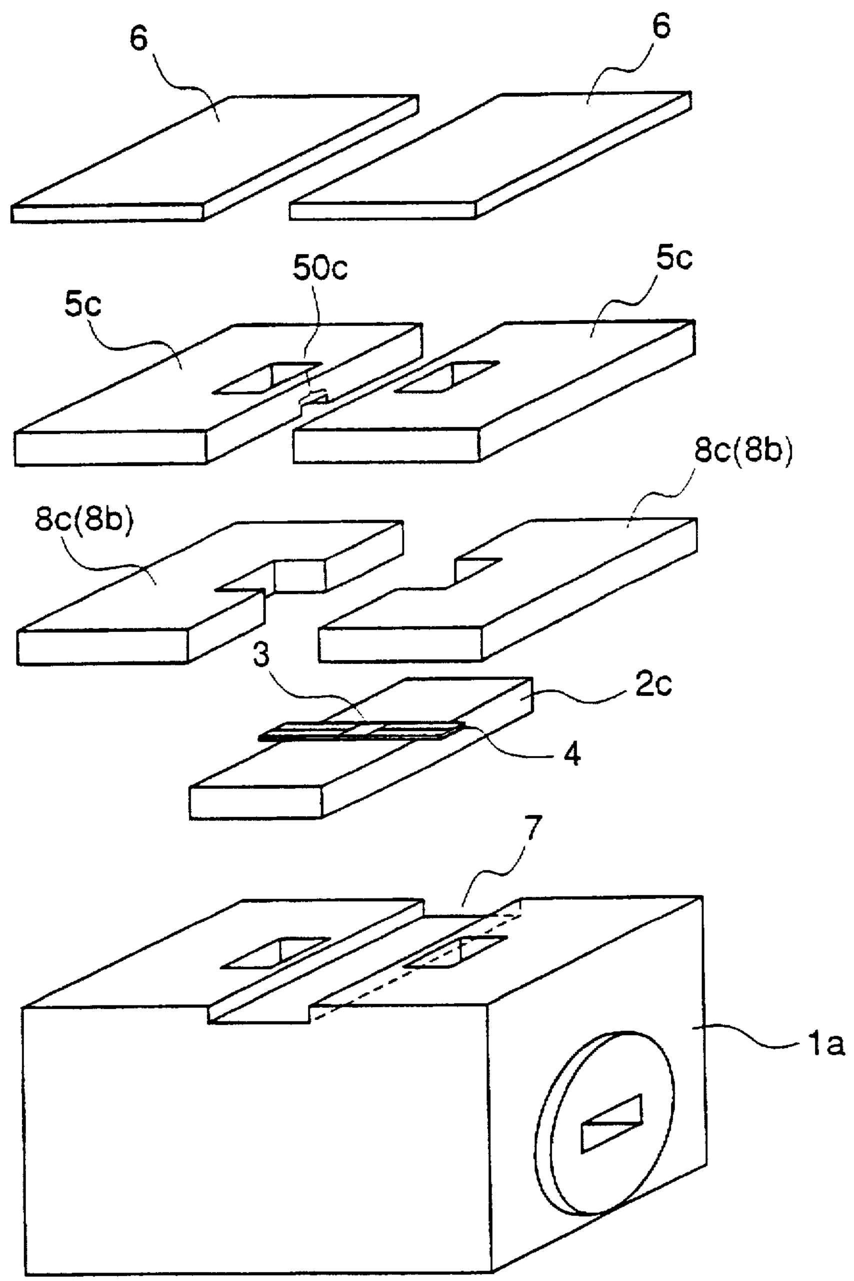
FIG. 9 is an exploded perspective view illustrating a semiconductor element evaluating apparatus according to a second transformation in the third embodiment of the present invention.

In this first modification, as shown in FIG. 8, portions of both side surfaces of a semiconductor carrier **2*b* and concavities on side surfaces of respective side block parts 8*b* are combined to form the waveguide parts 10*b*, respectively. More specifically, the semiconductor carrier 2*b* having a waveguide forming portion as one of the four inner wall surfaces of the waveguide part 10*b*, and the side block parts 8*b* each having a waveguide forming portion (a concavity) as three of the four inner wall surfaces of the waveguide part 10*b* form portions corresponding to the waveguide parts 10*b* of the mode converting carrier 2 shown in FIG. 1. Therefore, the form of the semiconductor carrier 2*b* is simpler than that of the semiconductor carrier 2*a* shown in FIG. 6**.

Modification 2.

In the third embodiment and in the first modification of the third embodiment, in order to form the aperture 100 for converting the signal mode between the microstrip line 4 and the waveguide 10, a concavity is provided at the semiconductor carrier. However, in this second modification, as shown in FIG. 9, instead of providing the concavity for forming the aperture 100 at the semiconductor carrier **2*c*, a concavity 50*c* is provided at each spacer 5*c*, so that the semiconductor carrier 2*c* has no concavity. Therefore, the form of the semiconductor carrier 2*c*** is simpler than those of the third embodiment and the first modification of the third embodiment.

As described above, in the third embodiment of the invention, since the mode converting carrier 2 described in the first embodiment is formed by the semiconductor carrier and the side block parts, the form of the semiconductor carrier on which the semiconductor element is mounted is simpler than those of the mode converting carriers 2 according to the first and second embodiments, whereby the fabricating process of the semiconductor carrier is simplified and it is possible to reduce the cost for exchanging semiconductor elements, in addition to the effects in the first and second embodiments. Also, since every corner in a cross-sectional configuration of the waveguide approaches a right angle, the reflection loss and the transmission loss of the signals can be reduced.

[Embodiment 4]

A description is given of a fourth embodiment of the present invention.

Figure 10:
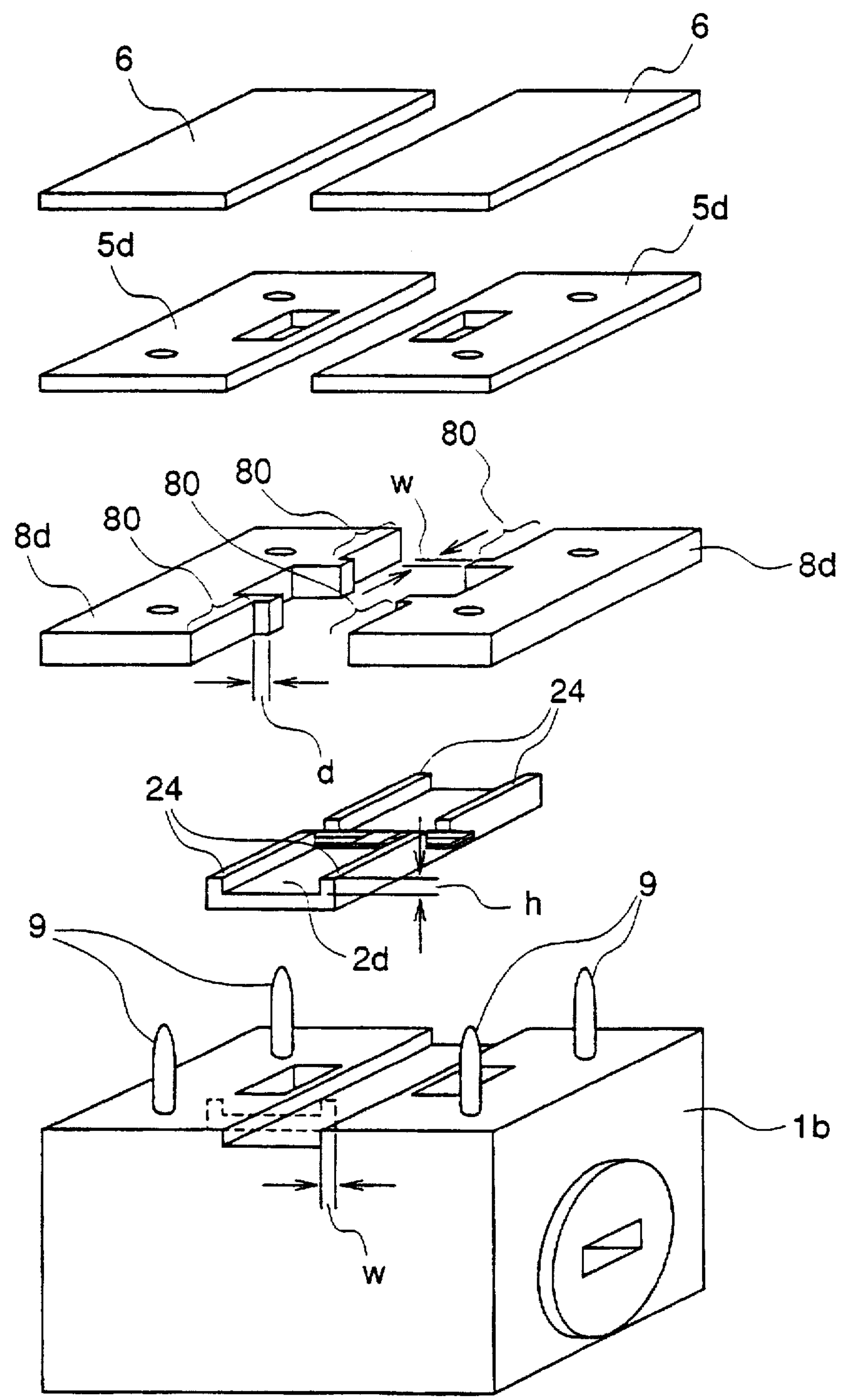
FIG. 10 is an exploded perspective view illustrating a semiconductor element evaluating apparatus in accordance with a fourth embodiment of the present invention.

FIG. 10 is an exploded perspective view illustrating a semiconductor element evaluating apparatus according to the fourth embodiment of the invention. In the figure, reference numeral **2*d* designates a semiconductor carrier. Alignment poles 9 for positioning the respective parts are disposed on a pedestal 1*b*. Side blocking parts 8*d* have through holes for receiving the respective alignment poles 9, and spacers 5*d* have through holes or concavities for receiving the respective alignment poles 9. Concave portions 80 are provided at the respective side block parts 8*d***

In the fourth embodiment of the invention, the side block parts **8*d* and the semiconductor carrier 2*d*** which form the mode converting carrier as in the third embodiment are formed as described below.

Each side block part **8*d* has concave portions 80 on the side surface adjacent to the semiconductor carrier 2*d*, each concave portion being spaced from the inner wall surface of the waveguide part 10*b* by ¼ of the operating frequency wavelength ($\lambda/4$) in the direction perpendicular to the inner wall surface, and having a prescribed width and a depth of $\lambda/4$. The semiconductor carrier 2*d* has projections 24 on the upper surface where the spacers 5*d* are later placed, each projection having a width of $\lambda/4$ from the side surface of the semiconductor carrier 2*d*, a portion of which forms one of the four inner wall surfaces of the waveguide part 10*b*. Further, the alignment poles 9 for positioning the respective parts are located on the pedestal 1*b*, and the through holes for the respective alignment poles 9 are located in the side block parts 8*d* and the spacers 5*d***.

A description is given of the function.

In the fourth embodiment of the invention, the side block parts **8*d* have the concave portions 80 on the side surfaces adjacent to the semiconductor carrier 2*d*, each concave portion being spaced from the inner wall surface of the waveguide part 10*b* by $\lambda/4$ in the direction perpendicular to the inner wall surface, and having a prescribed width and a depth of $\lambda/4$. So, the semiconductor carrier 2*d* and the side block parts 8*d* are bonded to each other mainly in the vicinity of the bonded portions of the waveguide parts 10*b***.

Therefore, even when there are irregularities on the adjacent side surfaces of the semiconductor carrier 2d and the side block parts 8d except in the vicinity of the bonded portions, these irregularities do not adversely affect the bonding of the semiconductor carrier 2d and the side block parts 8d because the concave portions 80 are formed thereon, whereby the bonded portions of the waveguide parts 10b are adhered closely to each other with high reliability.

The width between the inner wall surface of the waveguide part and the concave portion 80 is λ/4, and the depth of the concave portion 80 from the side surface adjacent to the semiconductor carrier 2d is λ/4. Therefore, as described in the second embodiment, the open-circuit characteristic of the side surface of the concave portion 80 opposite to the inner wall surface of the waveguide part is emphasized when the side surface is seen from the inner wall surface of the waveguide part, whereby the short-circuit characteristic of the inner wall surface of the waveguide part is emphasized. In addition, since the bottom surface of the concave portion 80 is formed at a distance of λ/4 from the side surface of the side block part 8d adjacent to the semiconductor carrier 2d, the short-circuit characteristic of the bonded portions of the waveguide parts is further emphasized.

Consequently, because the short-circuit characteristic of the inner wall surfaces in the vicinity of the bonded portions of the waveguide parts is emphasized, the impedance values at the respective positions of the inner wall surfaces at the bonded portions of the waveguide parts are made uniform, whereby the continuity of the inner wall surfaces at the bonded portions of the waveguide parts is emphasized.

Further, since the semiconductor carrier 2d has projections 24 on the upper surface where the spacers 5d are later placed, each projection having a width of λ/4 from the side surface of the semiconductor carrier 2d, a portion of which forms one of the four inner wall surfaces of the waveguide part 10b, the semiconductor carrier 2d and the spacers 5d are bonded to each other at the projections 24. Therefore, even when there are irregularities on the adjacent surfaces of the semiconductor carrier 2d and the spacers 5d except at the projections 24, these irregularities do not adversely affect the bonding because the projections 24 are formed thereon, whereby the bonded portions of the waveguide parts 10b and waveguide terminal parts 10c can be adhered closely to each other with high reliability.

The width of the projection 24 from the side surface of the semiconductor carrier 2d, a portion of which forms the inner wall surface of the waveguide part, is λ/4, and the height of the projection 24 to the surface adjacent to the spacers 5d is λ/4. Therefore, as described in the second embodiment, the open-circuit characteristic of the side surface of the projection 24 opposite to the inner wall surface of the waveguide part is emphasized when the side surface is seen from the inner wall surface of the waveguide part, whereby the short-circuit characteristic of the inner wall surface of the waveguide part is emphasized. In addition, since the height to upper portion of the projection 24 bonded to the spacer 5d is λ/4, the short-circuit characteristic of the bonded portions of the waveguide parts is further emphasized.

Consequently, because the short-circuit characteristic of the inner wall surfaces in the vicinity of the bonded portions of the waveguide parts is emphasized, the impedance values at the respective positions of the inner wall surfaces at the bonded portions of the waveguide parts are made uniform, whereby the continuity of the inner wall surfaces at the bonded portions of the waveguide parts is emphasized.

Furthermore, in the fourth embodiment of the invention, since the alignment poles 9 for positioning the respective parts are formed on the pedestal 1b, the poles 9 are put in the respective through holes of the parts when the parts of the semiconductor element evaluating apparatus are assembled. Therefore, the positioning of the respective parts is simply and accurately carried out, whereby it is possible to make the bonding of the side block parts 8d and the semiconductor carrier 2d and the bonding of the spacers 5d and the semiconductor carrier 2d better.

The shape and the number of the alignment poles 9 are not limited to those shown in FIG. 10 as long as the parts of the apparatus are accurately fixed to their positions by the alignment poles.

As described above, in the fourth embodiment of the invention, the side block parts 8d have the concave portions 80 on the side surfaces adjacent to the semiconductor carrier 2d , each concave portion being spaced from the inner wall surface of the waveguide part 10b by λ/4 in the direction perpendicular to the inner wall surface, and having a prescribed width and a depth of λ/4, the semiconductor carrier 2d and the side block parts 8d are bonded to each other mainly in the vicinity of the bonded portions of the waveguide parts 10b, and the semiconductor carrier 2d has projections 24 on the upper surface where the spacers 5d are later placed, each projection having a width of λ/4 from the side surface of the semiconductor carrier 2d , a portion of which forms one of the four inner wall surfaces of the waveguide part 10b. Therefore, the bonded portions of the waveguides between the side block parts 8d and the semiconductor carrier 2d and between the semiconductor carrier 2d and the spacers 5d can be adhered closely to each other with high reliability and the continuity of the bonded portions of the waveguides can be emphasized, in addition to the effect in the third embodiment.

[Embodiment 5]

A description is given of a fifth embodiment of the present invention.

Figure 11:
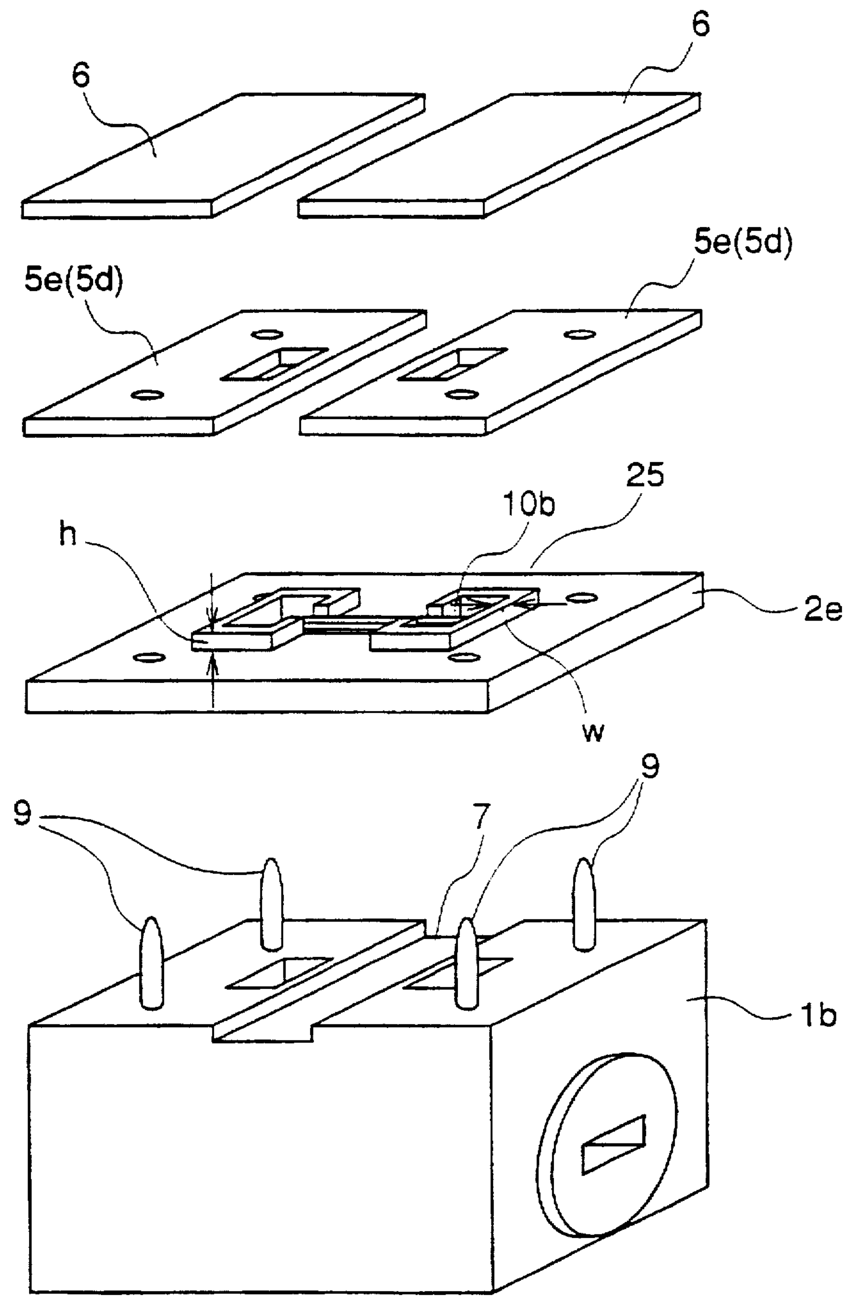
FIG. 11 is an exploded perspective view illustrating a semiconductor element evaluating apparatus in accordance with a fifth embodiment of the present invention.

FIG. 11 is an exploded perspective view illustrating a semiconductor element evaluating apparatus according to the fifth embodiment of the invention. In the figure, projections 25 are provided around apertures as the waveguide parts 10b of a mode converting carrier 2e, respectively. The same reference numerals are used to designate the same or corresponding portions as those shown in FIGS. 1 and 10.

The mode converting carrier 2e of the semiconductor element evaluating apparatus according to the fifth embodiment has the projections 25 formed around the apertures of the waveguide parts 10b, respectively, on the upper surface where spacers 5e are later placed, except where the microstrip lines 4 are located, each projection having a width equivalent to ¼ of the operating frequency wavelength (λ/4) from each of the inner wall surfaces of the waveguide part 10b and having a height of λ/4.

A description is given of the function.

As shown in FIG. 11, since the projections 25 surround the apertures of the waveguide parts 10b, respectively, the mode converting carrier 2e and the spacers 5e are bonded to each other mainly in the vicinity of the inner wall surfaces at the bonded portions of the waveguide parts 10b and the waveguide terminal parts 10c. Therefore, even when there are irregularities on the upper surface of the mode converting carrier 2e and on the lower surface of the spacers 5e except in the vicinity of the inner wall surfaces, these irregularities do not adversely affect the bonding of the mode converting carrier 2e and the spacers 5e because the projections 25 are formed thereon, whereby the bonded portions of the waveguide parts 10b and the waveguide terminal parts 10c can be adhered closely to each other with high reliability.

The width of the projection 25 from the inner wall surface of the waveguide part 10b is λ/4. Therefore, as described in the second embodiment, the open-circuit characteristic of the side surface of the projection 25 opposite to the inner wall surface of the waveguide part is emphasized when the side surface is seen from the inner wall surface of the waveguide part, whereby the short-circuit characteristic of the inner wall surface of the waveguide part is emphasized. In addition, since the height of the projection 25 is λ/4, the short-circuit characteristic of the bonded portions of the waveguide parts is further emphasized.

Consequently, because the short-circuit characteristic of the inner wall surfaces in the vicinity of the bonded portions of the waveguide parts is emphasized, the impedance values at the respective positions of the inner wall surfaces at the bonded portions of the waveguide parts are made uniform, whereby the continuity of the inner wall surfaces at the bonded portions of the waveguide parts is emphasized.

While in the fifth embodiment of the invention the inseparable mode converting carrier 2e is used, a mode converting carrier which can be separated into a semiconductor carrier and side block parts as described in the third embodiment may be applied to the structure of the fifth embodiment. In addition, the projections 25 on the upper surface of the mode converting carrier 2e are provided at the lower surface thereof, whereby the continuity of the bonded portions of the waveguide parts between the mode converting carrier 2e and the pedestal 1b is emphasized due to the same function.

Figure 12:
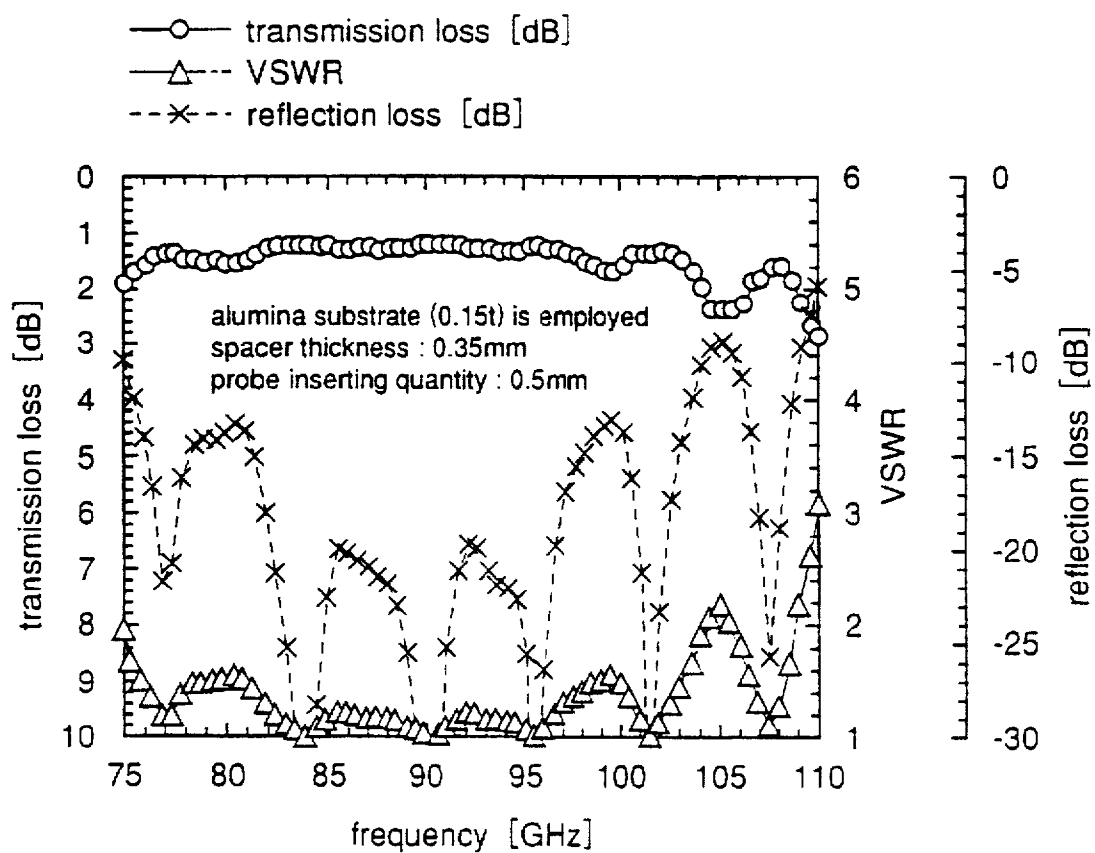
FIG. 12 is a graph showing the transmission loss of the semiconductor element evaluating apparatus according to the fifth embodiment of the present invention.
Figure 13:
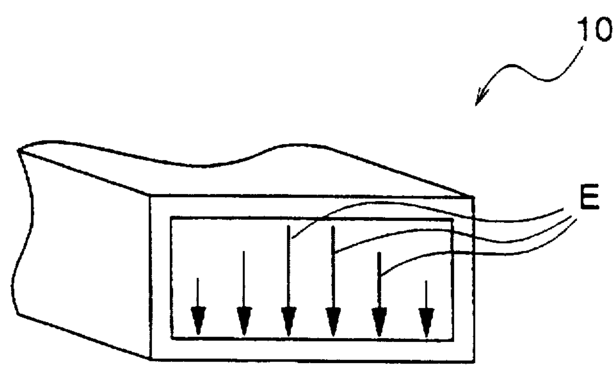
FIG. 13 is a perspective view showing a general transmission mode of a metal waveguide.

FIG. 12 is a graph showing the transmission loss in a 90 GHz band when the semiconductor element evaluating apparatus shown in FIG. 11 is used.

Generally, the transmission loss is below 2.0 dB and the reflection loss is below −12 dB in the prior art apparatus. In the fifth embodiment of the invention, however, the transmission loss is below 1.3 dB, the reflection loss is below −17 dB, and the voltage standing wave ratio (VSWR) is below 1.3 in 82–96 GHz, as shown at FIG. 12, which means that the characteristics of the semiconductor element evaluating apparatus are improved.

As described above, in the fifth embodiment of the invention, the mode converting carrier 2e has the projections 25 formed around the apertures of the waveguide parts 10b, respectively, on the upper surface where spacers 5e are later placed, except where the microstrip lines 4 are located, each projection having a width of λ/4 from each of the inner wall surfaces of the waveguide part 10b and having a height of λ/4. Therefore, in addition to the effects in the first and second embodiments, the continuity of the bonded portions of the waveguides between the mode converting carrier 2e and the spacers 5e is further emphasized.

The semiconductor element evaluating apparatus according to the present invention may be used not only in an inspecting process but also for packages or modules in various systems.

What is claimed is:

1. A semiconductor element evaluating apparatus for evaluating an electrical characteristic of a semiconductor element used in a microwave band comprising:

a pedestal having a front surface and first and second hollow waveguides for exchanging signals with external devices, each hollow waveguide penetrating the pedestal and having inner wall surfaces;

a mode converting carrier member having a first surface, placed, on the pedestal, having a region where a semiconductor element is to be mounted, having first and second hollow waveguide parts having inner wall surfaces aligned with the respective first and second hollow waveguides of the pedestal, and having first and second microstrip lines sandwiching the region where a semiconductor element is mountable and connectable to the semiconductor element, each microstrip line converting a signal propagation mode between the microstrip line and one of the first and second hollow waveguides; and waveguide terminal structures placed on the mode converting carrier member, respectively having first and second waveguide terminal parts for terminating the respective first and second hollow waveguide parts of the mode converting carrier member, signals input to the first hollow waveguide propagating successively through the first hollow waveguide, the first microstrip line, a mounted semiconductor element, the second microstrip line, and the second hollow waveguide for evaluating the semiconductor element.

2. The semiconductor element evaluating apparatus of claim 1 wherein each of the first and second hollow waveguides of the pedestal includes a 90° bend so that a signal input part of the first hollow waveguide and a signal output part of the second hollow waveguide lie on a straight line, and ends of the first and second hollow waveguides at the mode converting carrier member are parallel to each other.

3. The semiconductor element evaluating apparatus of claim 1 wherein the pedestal has a concave portion between ends of the first and second hollow waveguides on the first surface of the pedestal where the mode converting carrier member is placed, the concave portion being spaced from each of the opposite inner wall surfaces at the ends of the first and second hollow waveguides on the first surface of the pedestal by ¼ wavelength at an operating frequency in a direction perpendicular to the opposite inner wall surfaces, and has a width and a depth of the ¼ wavelength.

4. The semiconductor element evaluating apparatus of claim 1 wherein the mode converting carrier member has projections on a first surface where the waveguide terminal structures are placed, each projection having a width of ¼ wavelength at an operating frequency from each of the inner wall surfaces of the hollow waveguide parts of the mode converting carrier member and having a height of the ¼ wavelength.

5. The semiconductor element evaluating apparatus of claim 1 wherein the mode converting carrier member has a region where a semiconductor element is to be mounted and regions where the microstrip lines are mounted, and comprises a semiconductor carrier member having right and left side surfaces and having first and second waveguide forming portions, each of the first and second waveguide forming portions respectively forming one of the inner wall surfaces of the hollow waveguide parts of the mode converting carrier member, and first and second side block parts adjacent to the right and left side surfaces of the semiconductor carrier member sandwiching the semiconductor carrier member and respectively having third and fourth waveguide forming portions, each of the third and fourth waveguide forming portions respectively forming three inner wall surfaces of the hollow waveguide parts.

6. The semiconductor element evaluating apparatus of claim 1 wherein the mode converting carrier member has a region where a semiconductor element is to be mounted and regions where the microstrip lines are mounted, and comprises a semiconductor carrier member having right and left side surfaces and having first and second waveguide forming portions, each of the waveguide forming portions respectively forming three of the inner wall surfaces of the hollow waveguide parts, and first and second side block parts adjacent to the right and left side surfaces of the semiconductor carrier member sandwiching the carrier member and respectively having third and fourth waveguide forming portions, each of the third and fourth waveguide forming portions respectively forming one inner wall surface of the hollow waveguide parts.

7. The semiconductor element evaluating apparatus of claim 5 wherein the first and second side block parts have concave portions on side surfaces of the side block parts adjacent to the semiconductor carrier member, each concave portion being spaced from an inner wall surface of the hollow waveguide part perpendicular to the side surface of the side block part by ¼ wavelength at an operating frequency in a direction perpendicular to the inner wall surface and having a width and a depth of the ¼ wavelength.

8. The semiconductor element evaluating apparatus of claim 6 wherein the first and second side block parts have concave portions on side surfaces of the side block parts adjacent to the semiconductor carrier member, each concave portion being spaced from an inner wall surface of the hollow waveguide part perpendicular to the side surface of the side block part by ¼ wavelength at an operating frequency in a direction perpendicular to the inner wall surface and having a width and a depth of the ¼ wavelength.

* * * * *